United States Patent
De Vries et al.

(10) Patent No.: US 8,634,062 B2
(45) Date of Patent: Jan. 21, 2014

(54) ACTUATOR SYSTEM, LITHOGRAPHIC APPARATUS, METHOD OF CONTROLLING THE POSITION OF A COMPONENT AND DEVICE MANUFACTURING METHOD

(75) Inventors: Gosse Charles De Vries, Veldhoven (NL); Edwin Johan Buis, Belfeld (NL); Uwe Mickan, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 589 days.

(21) Appl. No.: 12/627,776

(22) Filed: Nov. 30, 2009

(65) Prior Publication Data
US 2010/0149506 A1    Jun. 17, 2010

Related U.S. Application Data

(60) Provisional application No. 61/122,336, filed on Dec. 12, 2008.

(51) Int. Cl.
 *G03B 27/54* (2006.01)
(52) U.S. Cl.
 USPC .......................................................... 355/67
(58) Field of Classification Search
 USPC ............................................. 355/52, 55, 67
 See application file for complete search history.

(56) References Cited

U.S. PATENT DOCUMENTS

| | | | |
|---|---|---|---|
| 2,319,406 A * | 5/1943 | Jones | 318/686 |
| 5,731,909 A | 3/1998 | Schachar | |
| 2004/0008419 A1* | 1/2004 | Schachar | 359/666 |
| 2008/0024038 A1* | 1/2008 | Chen et al. | 310/317 |
| 2008/0239268 A1 | 10/2008 | Mulder et al. | |

FOREIGN PATENT DOCUMENTS

| | | |
|---|---|---|
| CN | 1189219 A | 7/1998 |
| CN | 101276154 A | 10/2008 |
| EP | 493616 A1 * | 7/1992 |
| EP | 1419991 A2 * | 5/2004 |

* cited by examiner

*Primary Examiner* — Glen Kao
(74) *Attorney, Agent, or Firm* — Sterne, Kessler, Goldstein & Fox P.L.L.C.

(57) ABSTRACT

An actuator system is provided that is configured to move a component relative to a base of the actuator system. The actuator system may include first and second actuating elements, each including two sections of material that are joined to each other and have different coefficients of thermal expansion. The two actuating elements may be configured such that if the temperature of one is increased it applies a force on the component in a direction that is opposite to the force applied by the other actuating element if its temperature is increased. The actuator system may further include at least one power supply configured to provide independently controllable heating to the first and second actuating elements.

15 Claims, 7 Drawing Sheets

ACTUATOR SYSTEM, LITHOGRAPHIC APPARATUS, METHOD OF CONTROLLING THE POSITION OF A COMPONENT AND DEVICE MANUFACTURING METHOD

CROSS-REFERENCE TO RELATED APPLICATIONS

The present application claims the benefit under 35 U.S.C §119(e) of U.S. Provisional Patent Application No. 61/122,336, filed Dec. 12, 2008, which is incorporated herein by reference in its entirety.

BACKGROUND

1. Field

Embodiments of the present invention relate to an actuator system, a lithographic apparatus, a method of controlling the position of a component and a method for manufacturing a device.

2. Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The requirements for any component to be used within a lithographic apparatus are very strict. In particular, it is often necessary for the component to operate in a precise manner, namely with high accuracy. It is also typically necessary for the component to be able to operate without having any impact on other components within the apparatus. For example, in a lithographic apparatus that transfers a pattern to a substrate using EUV radiation, many components may be required to operate within a vacuum chamber. Therefore, such components must be compatible with low pressure environments. In particular, it may be important to ensure that no outgassing occurs at low pressures. For components that require control systems, this may be particularly difficult because of the constraints imposed on, for example, wires providing control signals from a controller, that may be outside of the vacuum chamber, to the component, that may be inside the vacuum chamber.

Furthermore, due to their complexity, lithographic apparatus may be relatively expensive. Accordingly, it is continually necessary to ensure that each component is not unduly expensive in order to ensure that the overall cost of the lithographic apparatus does not become excessive. For components such as actuators, additional requirements for their use within a lithographic apparatus may include speed of response.

Piezoelectric actuators have previously been used as actuators with lithographic apparatus. However, known piezoelectric actuators may be relatively expensive. In addition, known piezoelectric actuator systems typically require a relatively complex control system and many connecting wires to control them, both further increasing the costs, in particular in relation to their use in a vacuum chamber.

SUMMARY

It is desirable to provide an actuator system that may have advantages that cannot be provided by presently known actuator systems.

According to an aspect of the invention, there is provided an actuator system configured to move a component relative to a base of the actuator system, wherein the component is set apart from the base in a first direction. The actuator system may include first and second actuating elements, each having a first end connected to the base and a second end connected to the component. The first actuating element may include first and second sections of material that are joined to each other, and both sections may extend from the first end to the second end of the actuating element. The second actuating element may include third and fourth sections of material that are joined to each other, and both may extend from the first end to the second end of the actuating element. The coefficient of thermal expansion of the first section of material may be different from that of the second section material, and the coefficient of thermal expansion of the third section of material may be different from that of the fourth section of material. The first and second actuating elements may each be configured such that, if the temperature of the actuating element increases from a nominal working temperature, the actuating element applies a force to the component to be actuated that is parallel to a second direction, perpendicular to the first direction, and such that the force applied by the first actuating element when its temperature increases is in an opposite direction to the force applied by the second actuating element when its temperature increases. The actuator system may further include at least one power supply, configured to provide heat to the first and second actuating elements, in which the at least one power supply can control the heat provided to the first actuating element independently from the heat provided to the second actuating element.

According to an aspect of the invention there is provided an actuator system as described above, further including an actuator controller, which is configured to control the actuator system by controlling the heat provided to the first and second actuating elements by the at least one power supply. The actuator controller may be configured such that, in order to actuate the actuator system from an unactuated position towards a first fully actuated position, the actuator controller provides heat to the first actuating element in order to raise the temperature of the first actuating element to a temperature above the nominal working temperature of the actuating element. In order to actuate the actuator system from an unactuated position to a second fully actuated position in the opposite direction to the first fully actuated position, the actuator controller may provide heat to the second actuating element in order to raise the temperature of the second actuating element to a temperature above the nominal working temperature of the actuating element. The actuator controller may be arranged to determine a desired temperature of an actuating element above the nominal working temperature of the actuating element that is required in order to provide a desired extent of actuation. Further, the actuator controller may include a memory, configured to store calibration data, and a processor, configured to determine a desired temperature of an actuating element above the nominal working temperature of the actuating element for a desired extent of actuation using the calibration data. Alternatively the actuator system may include a temperature sensor system, configured to monitor the temperature of at least a part of the actuating element, and the actuator controller may be configured to provide heat to the actuating element, based on the temperature of the actuating element monitored by the temperature sensor system. According to an aspect of the invention, the actuator controller is configured to raise the temperature of an actuating element above the nominal working temperature of the actuating element to provide a desired extent of actuation by providing heat to the actuating element at a first rate for a first duration of time and subsequently providing heat to the actuating element at a second rate, wherein the first rate is higher than the second rate, and the second rate is sufficient to compensate for heat lost from the actuating element when it is at the temperature necessary in order to provide the desired extent of actuation. The actuator controller may include a memory, configured to store calibration data; and a processor, configured to determine, for a desired extent of actuation, at least one of the first rate for providing heat to the actuating element, the second rate for providing heat to the actuating element and the first duration of time using the calibration data.

According to a further aspect of the invention, there is provided a lithographic apparatus including a radiation beam conditioning system, configured to configure a beam of radiation; patterning device, configured to pattern the conditioned beam of radiation; and a projection system, configured to project the patterned beam of radiation onto a substrate, wherein at least one of the radiation beam conditioning system and the projection system includes at least one optical element and an actuator system, as above wherein the component now is the optical element, arranged to control the position of the optical element. According to an aspect of the invention, the radiation beam conditioning system of the lithographic apparatus includes first and second arrays of reflectors, each reflector of the first array of reflectors is configured to direct radiation from an intermediate point of focus of the beam of radiation onto one of the reflectors of the second array of reflectors. The reflectors of the second array of reflectors may be configured to project an image onto the patterning device of the reflector of the first array that is directing radiation onto the reflector of the second array, and at least one of the reflectors of the first array of reflectors is the component of an actuator system as described above, configured to control the position of the reflector in order to control to which of the reflectors of the second array of reflectors the radiation incident on the reflector is directed.

According to an aspect of the invention, there is provided a method of controlling the position of a component, including providing an actuator system configured to move the component relative to a base of the actuator system that is set apart from the component in a first direction. The actuator system may include first and second actuating elements, each having a first end connected to the base and a second end connected to the component. The first actuating element may include first and second sections of material that are joined to each other, and both sections extend from the first end to the second end of the actuating element. The second actuating element may include third and fourth sections of material that are joined to each other, and both may extend from the first end to the second end of the actuating element. The coefficient of thermal expansion of the first section of material may be different from that of the second section of material. The coefficient of thermal expansion of the third section of material may be different from that of the fourth section of material. The first and second actuating elements may each be configured such that, if the temperature of the actuating element increases from a nominal working temperature, the actuating element applies a force to the component to be actuated that is parallel to a second direction, perpendicular to the first direction, and such that the force applied by the first actuating element when its temperature increases is in an opposite direction to the force applied by the second actuating element when its temperature increases. The method may further include providing heat to the first and second actuating elements in order to actuate the actuator system, wherein the heat may be provided to the first actuating element independently from the heat provided to the second actuating element.

According to an aspect of the invention, there is provided a method of manufacturing a device, including conditioning a beam of radiation using a radiation beam conditioning system; patterning the conditioned beam of radiation; and projecting the patterned beam of radiation onto a substrate using a projection system, wherein the method further includes controlling the position of at least one optical component of the radiation beam conditioning system or the projection system using the method above.

According to an aspect of the invention, there is provided an actuator system configured to move a component relative to a base of the actuator system, wherein the component is set apart from the base in a first direction. The actuator system may include an actuating element, having a first end connected to the base and a second end connected to the component. The actuating element may include first and second sections of material that are joined to each other, and both sections may extend from the first end to the second end of the actuating element. The coefficient of thermal expansion of the first section of material may be different from that of the second section material. The actuating element may be configured such that, if the temperature of the actuating element increases from a nominal working temperature, the actuating element applies a force to the component to be actuated that is parallel to a second direction, perpendicular to the first direction. The actuator system may include a heat sink, maintained at a nominal heat sink temperature that is lower than the nominal working temperature of the actuating element, and connected to the actuating element for thermal transfer.

According to an aspect of the invention, there is provided an actuator system configured to move a component relative to a base of the actuator system, wherein the component is set apart from the base in a first direction. The actuator system may include an actuating element, having a first end connected to the base and a second end connected to the component. The actuating element may include first and second sections of material that are joined to each other, and both sections may extend from the first end to the second end of the actuating element. The coefficient of thermal expansion of the first section of material may be different from that of the second section material. The actuating element may be configured such that, if the temperature of the actuating element increases from a nominal working temperature, the actuating element applies a force to the component to be actuated that is parallel to a second direction, perpendicular to the first direction. The actuating element may be configured such that the cross-sectional area of at least one of the first and second sections of material decreases from the first end to the second end.

According to an aspect of the invention, there is provided an actuator system configured to move a component relative to a base of the actuator system, wherein the component is set apart from the base in a first direction. The actuator system may include an actuating element, having a first end connected to the base and a second end connected to the component. The actuating element may include first and second sections of material that are joined to each other, and both sections may extend from the first end to the second end of the actuating element. The coefficient of thermal expansion of the first section of material may be different from that of the second section material. The actuating element may be configured such that, if the temperature of the actuating element increases from a nominal working temperature, the actuating element applies a force to the component to be actuated that is parallel to a second direction, perpendicular to the first direction. The actuator system may further include an electrically conducting loop, connected to the actuating element such that the electrically conducting loop and the actuating element together form an electric circuit; and a system for inducing an electric current in the electric circuit.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
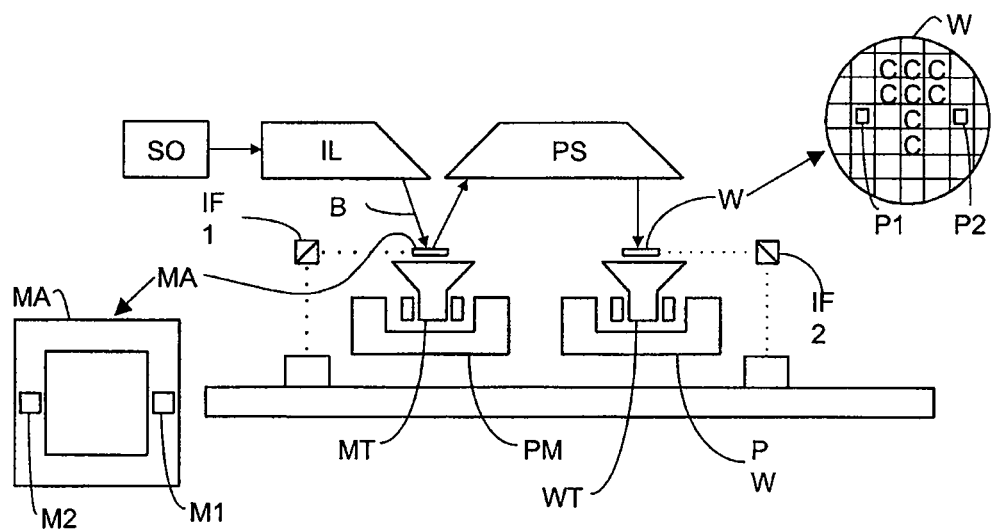
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 schematically depicts a lithographic apparatus according to one embodiment of the invention. The apparatus includes:

- an illumination system (illuminator) IL configured to condition a radiation beam B (e.g. UV radiation or EUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to radiation beam B by patterning device MA onto a target portion C (e.g. including one or more dies) of substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features.

Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from source SO to illuminator IL with the aid of a beam delivery system including, for example, suitable directing mirrors and/or a beam expander. In other cases the source may be an integral part of the lithographic apparatus, for example when the source is a mercury lamp. Source SO and illuminator IL, together with the beam delivery system if required, may be referred to as a radiation system.

Illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, illuminator IL may include various other components, such as an integrator and a condenser. The illuminator may be used to condition the radiation beam, to have a desired uniformity and intensity distribution in its cross-section.

Radiation beam B is incident on the patterning device (e.g., mask MA), which is held on the support structure (e.g., mask table MT), and is patterned by the patterning device. Having traversed mask MA, radiation beam B passes through projection system PS, which focuses the beam onto a target portion C of substrate W. With the aid of second positioner PW and position sensor IF2 (e.g. an interferometric device, linear encoder or capacitive sensor), substrate table WT can be moved accurately, e.g. so as to position different target portions C in the path of the radiation beam B. Similarly, first positioner PM and another position sensor IF1 can be used to accurately position mask MA with respect to the path of the radiation beam B, e.g. after mechanical retrieval from a mask library, or during a scan. In general, movement of mask table MT may be realized with the aid of a long-stroke module (coarse positioning) and a short-stroke module (fine positioning), which form part of first positioner PM. Similarly, movement of substrate table WT may be realized using a long-stroke module and a short-stroke module, which form part of second positioner PW. In the case of a stepper (as opposed to a scanner) mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on mask MA, the mask alignment marks may be located between the dies.

The depicted apparatus could be used in at least one of the following modes:

1. In step mode, mask table MT and substrate table WT are kept essentially stationary, while an entire pattern imparted to the radiation beam is projected onto a target portion C at one time (i.e. a single static exposure). Substrate table WT is then shifted in the X and/or Y direction so that a different target portion C can be exposed. In step mode, the maximum size of the exposure field limits the size of the target portion C imaged in a single static exposure.

2. In scan mode, mask table MT and substrate table WT are scanned synchronously while a pattern imparted to the radiation beam is projected onto a target portion C (i.e. a single dynamic exposure). The velocity and direction of substrate table WT relative to mask table MT may be determined by the (de-)magnification and image reversal characteristics of projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, mask table MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
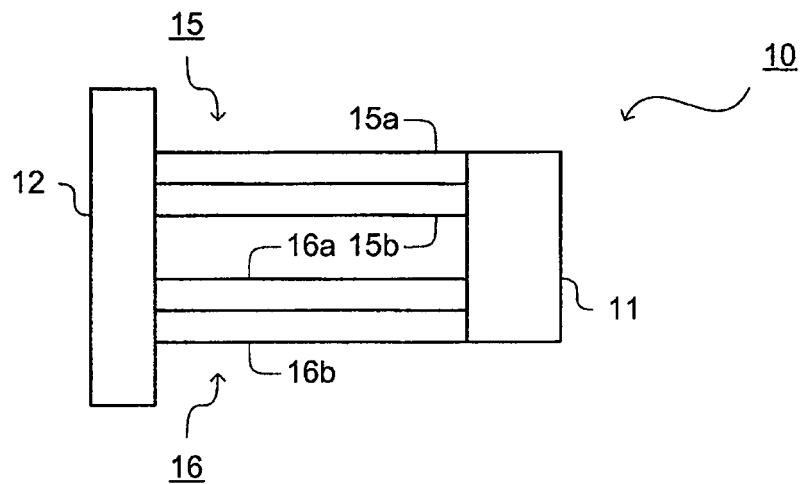
FIGS. 2a, 2b and 2c depict the arrangement of an actuator system according to an embodiment of the present invention.
Figure 2B:
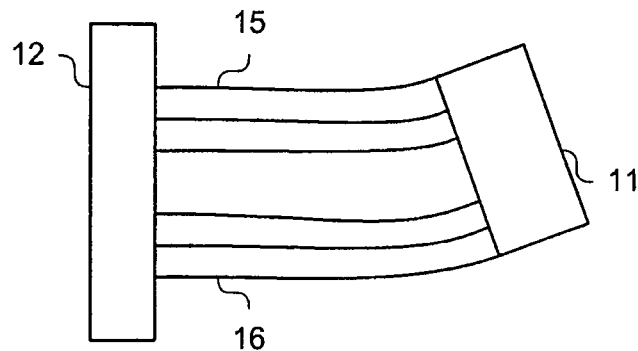
Figure 2C:
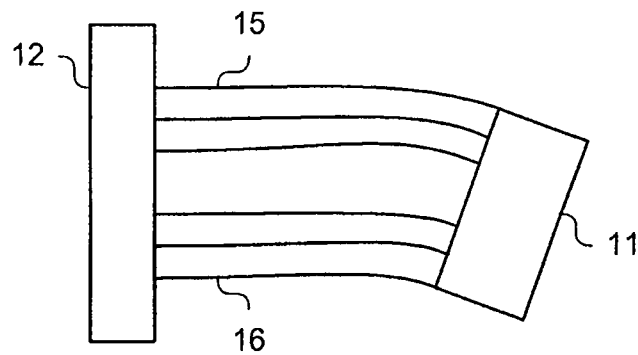

FIGS. 2a, 2b and 2c depict an actuator system 10 according to an embodiment of the present invention. The actuator system is configured to actuate a component 11 relative to a base 12. Actuator system 10 includes two actuating elements 15,16 that extend from base 12 to component 11.

As shown, actuating elements 15,16 may support component 11 relative to base 12. Alternatively or additionally, component 11 may be supported by an appropriate support structure that enables component 11 to be actuated by actuating elements 15,16. Furthermore, it should be appreciated that component 11 that is actuated by actuating system 10 may be a particular component within a system that is to be actuated. Alternatively, component 11 may be a mount or support that is configured to be connected to a particular further component within a system that is to be actuated.

Both of actuating elements 15,16 include two sections of material that are joined together. First actuating element 15 includes first and second sections of material 15a,15b and second actuating element 16 includes third and fourth sections of material 16a,16b.

The two sections of material that include each of actuating elements 15,16 may be selected to have different coefficients of thermal expansion. In other words, in an embodiment, the coefficient of thermal expansion of first section of material 15a is different from the coefficient of thermal expansion of second section material 15b. Likewise, in an embodiment, the coefficient of thermal expansion of third section of material 16a is different from the coefficient thermal expansion of fourth section of material 16b. For convenience, the same pairs of material may be used for each of the first and second actuating elements 15,16. In this embodiment, only two different types of material are provided. Furthermore, first and second actuating elements 15,16 may operate in a consistent manner. However, it should be appreciated that this need not be the case for all embodiments of the invention.

As described in more detail below, actuator system 10 is configured such that heating may be applied independently to each of first and second actuating elements 15,16. Accordingly, the temperature of actuating elements 15,16 may be controlled. FIG. 2a depicts the actuator system when both of actuating elements 15,16 are at a respective nominal working temperature, namely at a temperature at which the actuating elements are unactuated. It will be appreciated that the nominal working temperature of the two actuating elements 15,16 may be set to be the same. However, this need not be the case in all embodiments.

By heating one of actuating elements 15,16, raising its temperature above its nominal working temperature, the sections of material of that actuating element undergo thermal expansion. However, because the two sections of material have different coefficients of thermal expansion, bending is induced in the actuating element. This bending is used as the means of actuating component 11. In particular, the induced bending of the actuating element may apply a force to component 11 in a direction that is primarily perpendicular to the length of the actuating element, namely perpendicular to a direction of separation of component 11 from base 12.

The use of two sections of material having different coefficients of thermal expansion and being joined together such that when heated a bending is induced is well-known, for example in bimetallic strips that may be used in temperature sensor safety switches. However, a problem for using such an arrangement as an actuator as in embodiments of the present invention is that, although one may raise the temperature of the two sections of material relatively quickly by applying sufficient heating to the materials, thereby rapidly inducing the desired bending, it is far slower to return the materials to the unbended state. This is because the combination of the two sections of material only returns to the unbended state once they have returned to the nominal working temperature. It is significantly more difficult to decrease the time taken to return from a heated state to a nominal working temperature than it is to decrease the time taken to increase the temperature from a nominal working temperature to an elevated temperature.

However, the actuator system of embodiments of the present invention includes two actuating elements, each having two sections of material having different coefficients of thermal expansion. Accordingly, one of the actuating elements, for example actuating element 15, may be arranged such that when its temperature increases it actuates component 11 in a first direction, and the second actuating element, for example actuating element 16, may be arranged such that when its temperature increases it actuates component 11 in the opposite direction. Accordingly, it is possible to actuate component 11 in either direction rapidly by applying sufficient heat to one or other of actuating elements 15,16.

Furthermore, if component 11 has been actuated in a first direction by heating one of the actuating elements, component 11 may be actuated back towards the second direction rapidly by heating the second actuating element. In particular, it may be sufficiently heated that the bending induced by the second actuating element overcomes the bending induced by the first actuating element, at least to some extent. Therefore, the component 11 may be returned part-way to the unactuated position. Alternatively, it may be returned entirely to the unactuated position, namely to the position depicted in FIG. 2a. Alternatively it may be actuated in the second direction. In each of these cases, the actuation is provided merely by heating the second actuating element. It is therefore not dependent on the rate of cooling of the first actuating element.

However, actuator system 10 may not be repeatedly and rapidly actuated in alternate directions in an unlimited fashion. This is because to do so one would need to continually increase the temperature of the two actuating elements. Accordingly, it may be desirable once both actuating elements are at a temperature above the nominal working temperature to allow both actuating elements to cool towards the nominal working temperature. As explained in more detail below, by appropriate control of the cooling of the actuating elements, it is possible to cool the actuating elements until at least one of the actuating elements has reached the nominal working temperature without changing the actuation state of the actuator system from a desired extent of actuation.

FIGS. 2b and 2c help illustrate the arrangement of actuator system 10. In particular, in FIG. 2b, first actuating element 15 is heated such that its temperature is above the nominal working temperature, resulting in bending of first actuating element 15 and actuation of component 11. In FIG. 2c, second actuating element 16 is heated such that its temperature is above the nominal working temperature, resulting in bending of the second actuating element causing component 11 to be actuated in a direction that is the opposite of the actuation shown in FIG. 2b. It will be appreciated that, as shown in FIGS. 2b and 2c, the actuation of either of first and second actuating elements 15,16 may result in a deformation of the other of the two actuating elements. Accordingly, the materials used for the actuating elements should be sufficiently elastic to permit the deformation of the actuating element caused by the other actuating element being at an elevated temperature.

A variety of materials may be used to form the sections of material 15a,15b,16a,16b that constitute actuating elements 15,16. In an embodiment, the materials may be selected to be vacuum compatible if, for example, the actuator system is to be used within a lithographic apparatus using EUV radiation. Furthermore, the two sections of material used to form each actuating element may be selected in order to maximize the differences between the coefficients of thermal expansion, resulting in maximum actuation of the actuating element for a given change in temperature. Likewise, the materials may be selected in order to ensure, as described above, adequate elasticity when the other actuating element is actuated. Furthermore, the materials may be selected for their specific heat capacity and/or their heat conductivity in order to ensure that the actuating element can be cooled sufficiently quickly, when required. Particular materials that may be considered for use include, for example and without limitation, stainless steel, invar (namely an alloy of, for example, approximately 64% Fe and 36% Ni, which has a very low coefficient of thermal expansion), aluminum, copper, silver, gold, platinum, chromium, iron, titanium, tungsten and other metal alloys. It will be appreciated that other materials may also be considered. It should also be appreciated that the actuating elements 15,16 may also include additional sections of material. The additional sections may enable further optimization of the properties of the actuating elements.

As explained above, although the actuator system of embodiments of the present invention may be actuated in either direction relatively quickly without relying on cooling of actuating elements 15,16, for repeated actuating of the actuator system, it may be necessary to cool actuating elements 15,16 at appropriate times in order to return them to or towards the nominal working temperature of actuating element 15,16. In order to facilitate this, actuating elements 15,16 may be thermally connected to one or more heat sinks. The one or more heat sinks may be maintained at an appropriate heat sink temperature and may have a relatively large heat capacity such that the heat necessary to reduce the temperature of the actuating element by a desired amount may be drawn into the heat sink without significantly affecting the temperature of the heat sink, namely without significantly affecting the tendency of the heat to be drawn into the heat sink.

Figure 3:
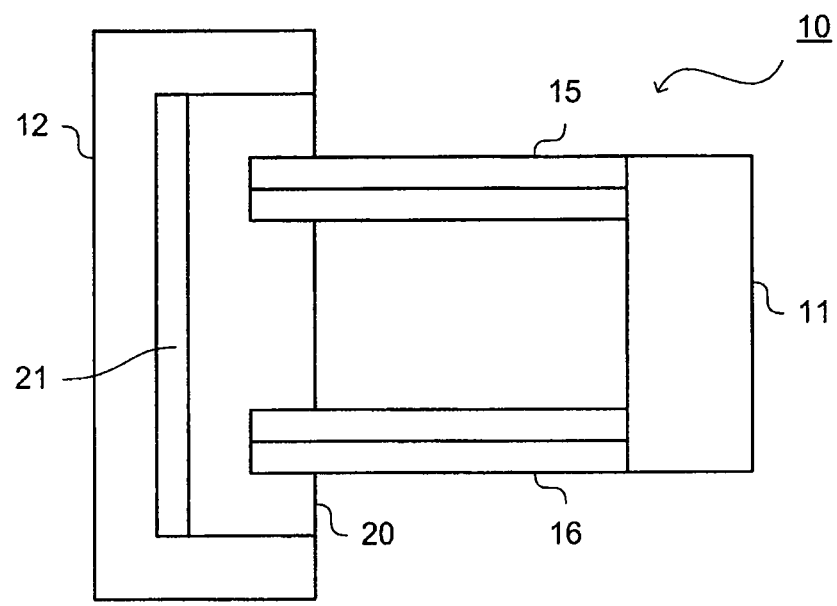
FIG. 3 depicts an optional arrangement of a feature of an actuator system according to an embodiment of the present invention.

FIG. 3 depicts a possible arrangement of a heat sink 20 that may be used in an actuator system 10 according to an embodiment of the present invention. In particular, as shown, a single heat sink 20 is thermally connected to first and second actuating elements 15,16 such that, if either actuating element 15,16 is at a temperature above the temperature of heat sink 20, heat is transferred to heat sink 20. Accordingly, heat sink 20 may be used to cool first and second actuating elements 15,16 quickly and efficiently.

As shown, heat sink 20 may be included as part of base 12 of the actuator system. Furthermore, heat sink 20 may include a temperature control system 21 that is arranged to maintain a substantially constant heat sink temperature within heat sink 20. For example, temperature control system 21 may include a cooling system that removes heat from heat sink 20 if the temperature of heat sink 20 rises above a given level above the intended heat sink temperature, although it will be appreciated that the variations of the temperature of heat sink 20 may be very much smaller than the variations of the temperature of actuating elements 15,16. In one example, a cooling system may be provided by configuring heat sink 20 to include conduits, through which a cooling fluid may be provided.

Actuator system 10, according to embodiments of the present invention, may be used in a variety of different circumstances. In particular, actuator system 10 may be used within a lithographic apparatus. For example, in a lithographic apparatus such as that described above, a radiation beam conditioning system for conditioning a beam of radiation before it is patterned by a patterning device may be provided. Likewise, a projection system for projecting a patterned beam of radiation onto a substrate may be provided. In either system, a variety of optical components are provided that perform various functions in respect of the beam of radiation. Some of these components may require periodic adjustments of their position. Accordingly, actuator system 10 may be used to control the position of those components.

In some embodiments using actuator system 10, a plurality of components that are immediately adjacent to one another may require positional control. In that case, a plurality of actuators 10 may be provided. In such an arrangement, a plurality of actuators 10 may share a common base 12 and, in particular, may share a common heat sink and, if required, a common temperature control unit 21 for heat sink 20. Such an arrangement may reduce the complexity of actuator systems 10 and/or reduce the cost of providing the actuator system.

Figure 4:
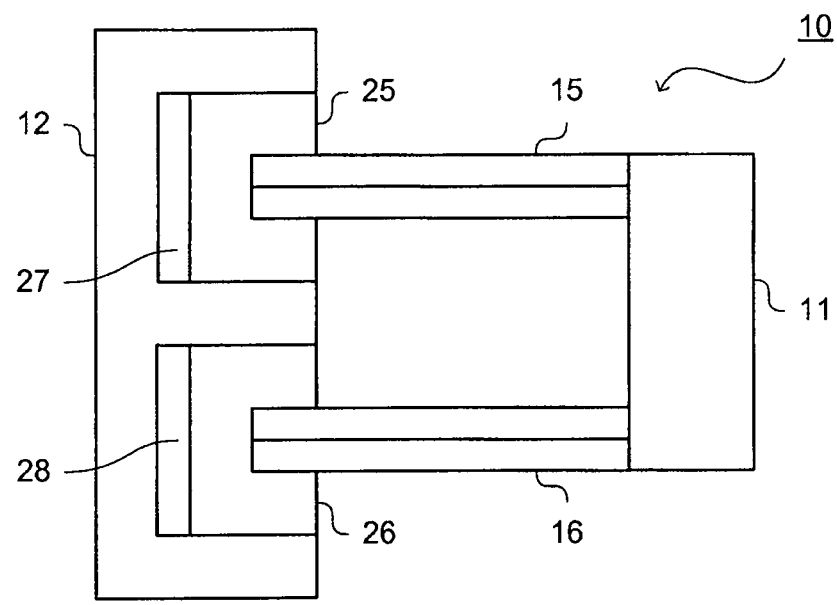
FIG. 4 depicts an alternative arrangement of an optional feature of an actuator system according to an embodiment of the present invention.

FIG. 4 depicts an alternative arrangement of heat sinks of an actuator system 10 according to an embodiment of the present invention. In particular, as shown, instead of a common heat sink, each of actuating elements 15,16 has a respective heat sink 25,26. Such an arrangement may be beneficial because it may prevent temperature changes in one of the actuating elements from affecting temperature changes in the other of the actuating elements. As shown in FIG. 4, if separate heat sinks 25,26 are provided, one or both of heat sinks 25,26 may be provided with a respective temperature controlling unit 27,28 provided to maintain the temperature of heat sinks 25,26 at a respective desired heat sink temperature.

Where separate heat sinks 25,26 are provided, both may be maintained at the same heat sink temperature. Alternatively, however, the heat sinks may be maintained at different heat sink temperatures.

Whether using a common heat sink 20 for first and second actuating elements 15,16 or using respective heat sinks 25,26, the desired heat sink temperature may be the same as the nominal working temperature of the actuating elements. However, this need not be the case in all embodiments. In particular, the time taken to cool actuating elements 15,16 is dependent on the temperature difference of actuating elements 15,16 and heat sink 20 or 25,26 to which the heat is to be transferred. Accordingly, the rate of cooling of actuating elements 15,16 may be increased by increasing the temperature difference between actuating elements 15,16 and heat sink 20 or 25,26. Therefore, heat sink temperature(s) may be set at a level that is below the nominal working temperature of actuating elements 15,16.

In an embodiment, accordingly, the nominal working temperature of actuating elements 15,16, namely the temperature at which actuating elements 15,16 are unactuated, may be set to be higher than the ambient temperature of the system in which actuator system 10 is to be used, and heat sink 20 or 25,26 may be maintained at a temperature that is substantially the same as the ambient temperature of the system within which actuator system 10 is to be used. In such an embodiment, heating must be provided constantly to actuating elements 15,16 in order to maintain the temperature of actuating elements above that of the heat sink 20 or 25,26 over and above any heating that is provided to actuating elements

15,16 in order to provide actuation. However, as explained above, such an arrangement may increase the rate of cooling of the actuating elements.

Alternatively or additionally, the heat sink temperature(s) of heat sink 20 or 25,26 may be set to be cooler than the ambient temperature of the system in which actuator 10 is to be used. Again, in this case, heating must be provided constantly to actuating elements 15,16 over and above that used to actuate actuating elements 15,16 in order to maintain the temperature of actuating elements 15,16 above the temperature of heat sink 20 or 25,26. Such an arrangement may be undesirable, however, because it may affect the temperature of other components within the system within which actuator system 10 is to be used.

It should further be appreciated that, although some embodiments in which the temperature of a heat sink may be set below the nominal working temperature of actuating elements 15,16 in order to improve the cooling rate of the actuating elements may be particularly beneficial for an actuator system having two actuating elements 15,16 that operate in opposite senses when they are heated (as depicted in FIGS. 2a, 2b and 2c), these arrangements may also be beneficial for an actuator system having a single actuating element. For example, in an actuator system having an actuating element including two sections of material that have different coefficients of thermal expansion, providing a heat sink at a temperature below the nominal working temperature of the actuating element may mean that it may actuate in one direction, as the actuating element cools, at a sufficiently fast rate that the actuator system is fit for its desired purpose. However, it should be understood that the actuator system would still be faster to operate in the direction of actuation caused by heating the actuating element than it is in the opposite direction, caused by cooling. Further, in such an embodiment, the actuating element may be configured such that heat is provided continuously to the actuating element in order to maintain it at the nominal working temperature.

Figure 5:
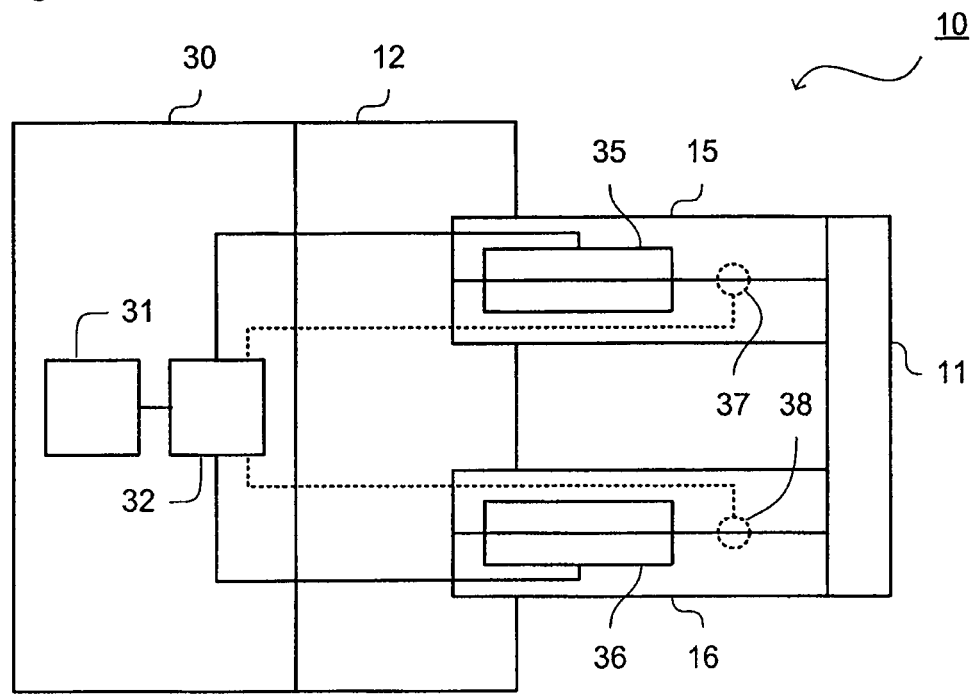
FIG. 5 depicts an optional arrangement of a feature of an actuator system according to an embodiment of the present invention.

As shown in FIG. 5, an actuator system 10 according to an embodiment of the present invention may include an actuator controller 30, which is configured to control actuator system 10. In an embodiment, actuator controller 30 may control the provision of heating to first and second actuating elements 15,16 in order to control the temperature, and therefore the actuation, of the actuating elements. In an embodiment, actuator controller 30 may control actuator system 10 to provide a desired level of actuation of component 11.

As shown schematically in FIG. 5, first and second actuating elements 15,16 may include first and second heaters 35,36, respectively, for heating actuating elements 15,16 under the control of actuator controller 30. Heaters 35,36 may, as schematically depicted in FIG. 5, be discrete heating elements that are provided in or thermally connected to actuating elements 15,16. However, actuating elements 15,16 may themselves be used as the used as heaters 35,36. In particular, actuating elements 15,16 may be configured such that an electric current can be made to flow within one or both of the sections of material that include actuating elements 15,16, the electric current providing a heating effect.

In one embodiment of an actuator system 10, actuator controller 30 may determine, for a desired extent of actuation of component 11, the required temperature of one of actuating elements 15,16 above the nominal working temperature, in order to provide the desired extent of actuation. In doing so, actuator controller 30 may take into account the temperature of the other actuating element. In other words, if the other actuating element is already at a temperature above its nominal working temperature, actuator controller 30 may determine the temperature rise of the first actuating element necessary to provide the desired extent of actuation, overcoming the preexisting actuation by the other actuating element.

In order to determine the desired temperature for a required extent of actuation, actuator controller 30 may include a memory 31 that stores calibration data that relates desired extents of actuation to necessary temperatures of the actuating elements above the nominal working temperature. Actuator controller 30 may also include a processor 32 that uses the calibration data in the memory to determine the required temperature for a required extent of actuation. The processor may be configured to interpolate between data points provided within the calibration data.

In an actuator system 10 configured in this manner, actuating elements 15,16 may also be provided with temperature sensors 37,38 that provide actuator controller 30 with measurements of the temperature of at least a part of the respective actuating element 15,16.

Temperature sensors 37,38 may be additional temperature sensor components installed within actuating elements 15,16. Alternatively or additionally, actuating elements 15,16 themselves may be used as the temperature sensors. In particular, the electrical resistance of actuating elements 15,16 may vary with temperature. Accordingly, actuator system 10 may be configured to measure the electrical resistance of actuating elements 15,16 and actuator controller 30 may, for example by means of appropriate calibration, determine the temperature of the actuating elements from the measured electrical resistance.

Accordingly, actuator controller 30 may control the heating of the actuating element to provide the desired increase in temperature above the nominal working temperature of the actuating element that it has determined is necessary for a required extent of actuation.

In an embodiment of an actuator system 10, the actuator controller may, in particular, be configured to raise the temperature of one of actuating elements 15,16 above the nominal working temperature by initially providing heat to the actuating element 15,16 at a relatively high rate, in order to raise the temperature of the actuating element relatively quickly. After a given period of time, once the temperature has risen appropriately to provide the desired extent of actuation, the rate at which heat is provided to the actuating element may then be reduced by actuator controller 30 to a lower level. The lower level corresponds to the heat that is required to maintain the actuating element 15,16 at the necessary temperature for the required extent actuation. This rate of providing heat to the actuating element 15,16 corresponds to the rate at which heat is lost from the actuating element, for example to the heat sink, if provided, and/or to the ambient environment of the system within which actuator system 10 is used.

The first rate of providing heat to actuating element 15,16 may be fixed, in which case actuator controller 30 controls the temperature that actuating element 15,16 reaches by controlling the duration of time at which the first rate of heat is provided before actuator controller 30 switches to the second rate of providing heat to actuating element 15,16. Accordingly, for example, in the arrangement discussed above, actuator controller 30 may control the heat to actuating element 15,16 to be provided at the first rate until the measured temperature reaches a given level and, thereafter, heat is provided to the actuating element at the second rate.

However, actuator controller 30 may be configured to determine a rate at which heat should be provided to actuating element 15,16 during the process of rating the temperature of actuating element 15,16. In other words, actuator controller 30 may determine the first rate of providing heat to actuating element 15,16. This may be beneficial because providing heat to actuating element 15,16 at a lower rate may facilitate accurate control of the temperature of actuating element 15,16, especially for relatively small required temperature rises, but providing heat to actuating element 15,16 at a higher rate results in faster temperature rises and, therefore, shorter actuation times which may be particularly desirable for relatively large required temperature rises.

In an embodiment of an actuator system 10, memory 31 of actuator controller 30 may include calibration data that relates the desired extent of actuation to one or more of the first rate for providing heat to actuating element 15,16, the second rate for providing heat to the actuating element and the duration of time for which the first rate should be used before switching to the second rate. Accordingly, processor 32 of actuator controller 30 may, for any desired extent of actuation, be able to determine the requisite heating conditions necessary to provide that desired extent of actuation.

Actuator controller 30 may be able to interpolate between data points provided within memory 31. Furthermore, actuator controller 30 may be configured to determine, from the calibration data in memory 31, the heating conditions necessary to actuate actuator system 10 to a required extent from a position in which it is already partially actuated. Actuator controller 30 may be provided with an algorithm that models the physical behavior of the actuator system, using appropriate calibration data such that it can determine the expected actuation of the actuator system in response to heat provided to the actuating elements. Consequently it may be configured to determine the heat that should be provided to the actuating elements in order to provide a desired extent of actuation.

In addition, regardless of the configuration of actuator controller 30, actuator controller 30 may be arranged such that once a desired actuation is completed, the first and second actuating elements, if they are both above their nominal working temperatures, may be allowed to cool until one of actuating elements 15,16 reaches its nominal working temperature, without changing the extent of actuation of component 11.

An advantage of an actuator system 10 according to an embodiment of the present invention having an actuator controller 30 as described above may be that the actuator system may not require a feedback mechanism in order to provide sufficiently accurate control of the actuation of component 11. In particular, the response of actuating elements 15,16 may be sufficiently consistent that sufficiently accurate control of the position of component 11 may be provided without monitoring the position of component 11. It will be appreciated, however, that if the system changes gradually over time, it may be necessary periodically to perform calibration tests in order to update calibration data stored in memory 31 within actuator controller 30.

Figure 6:
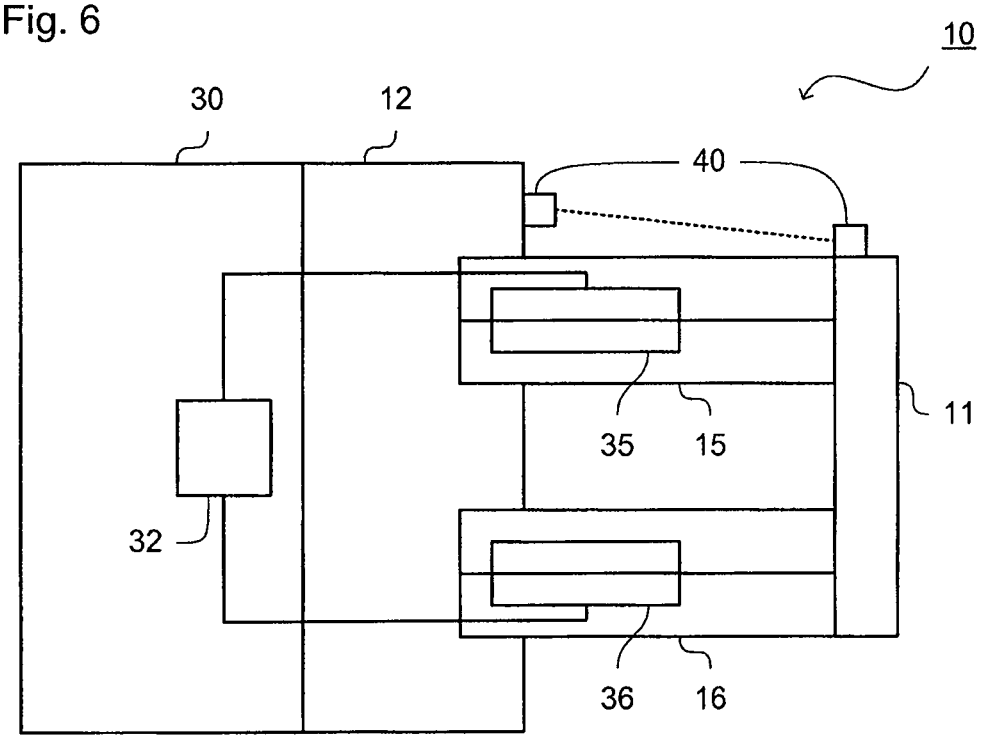
FIG. 6 depicts an arrangement of an optional feature of an actuator feature according to an embodiment of the present invention.

Alternatively or additionally, as depicted in FIG. 6, a position sensor 40 may be provided to monitor the response of actuator system 10 to the heating of actuating element 15,16 by heaters 35,36. Accordingly, a processor 32 within actuator controller 30 may use the position measurement provided by measurement system 40 in order to control the heating of the actuating elements or to adjust the control of the heating provided by heaters 35,36. In one embodiment, position measurement system 40 may not be used in operation of actuator system 10 but may only be used periodically in order to perform calibration measurements. Position measurement system 40 may, as depicted in FIG. 6, be arranged to measure the position of component 11 relative to base 12. Alternatively, position measurement system 40 may be depicted to measure the position of component 11 relative to another part of the system within which actuator system 10 is to be used.

Figure 7A:
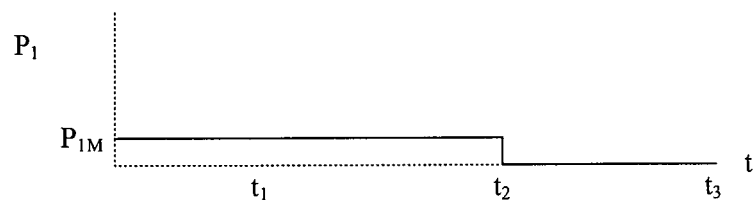
FIGS. 7a to 7e depict a possible mode of operation of an actuator system according to an embodiment of the present invention.
Figure 7B:
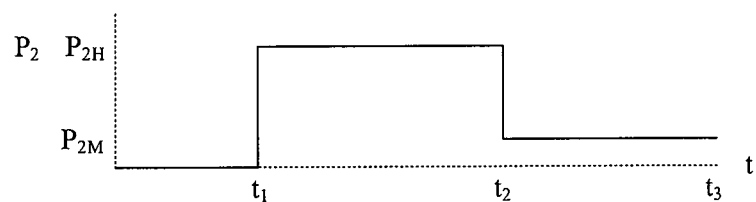
Figure 7C:
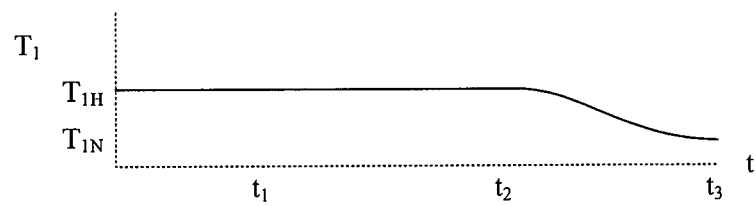
Figure 7D:
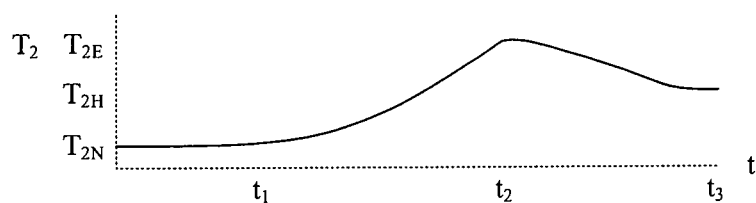
Figure 7E:
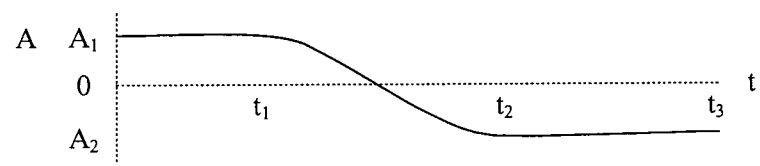

FIGS. 7a to 7e illustrate a mode of operation of an actuator system 10 according to an embodiment of the present invention. In this example, FIG. 7a depicts the rate $P_1$ at which heat is provided to first actuating element 15 over a time period t. FIG. 7b depicts the rate $P_2$ at which heat is provided to second actuating element 16 over the same time period. FIG. 7c depicts the temperature $T_1$ of first actuating element 15 over the given time period. FIG. 7d depicts the temperature $T_2$ of second actuating element 16 over the time period. FIG. 7e depicts the extent A of actuation of actuator system 10 between a first fully actuated position $A_1$, at which the first actuating element is actuated to a first maximum extent that the actuator system is rated to provide, and a second actuation extent $A_2$, at which the second actuating element 16 is actuated to the maximum extent that actuator system 10 is rated to provide.

As shown in FIGS. 7a to 7e, actuator system 10 is initially actuated towards the first maximum extent. Accordingly, the temperature of first actuating element 15 is at a level $T_{1H}$ that is above its nominal working temperature $T_{1N}$ and second actuating element 16 is at its nominal working temperature $T_{2N}$. As shown, in order to provide the required temperatures, heat is provided to first actuating element 15 at a relatively low rate $P_{1M}$ and no heating is provided to second actuating element 16. It will be appreciated, however, that if actuator system 10 were configured according to the options discussed above in which actuating elements 15,16 had a nominal working temperature above the temperature of the heat sink(s), the rate of providing heat to both actuating elements would be increased by an amount equivalent to the heating necessary to maintain the temperature of actuating elements 15,16 above the temperature of the heat sink(s).

At time $t_1$, it is desired to change the extent of actuation of actuation system 10 towards the second fully actuated extent. Accordingly, the heating provided to the second actuating element is increased at time $t_1$ to a relatively high level $P_{2H}$ in order to rapidly increase the temperature $T_2$ of second actuating element 16 to a temperature $T_{2E}$ that is sufficient to overcome the actuation of first actuating element 15 whilst it is at its existing temperature $T_{1H}$ above its nominal working temperature $T_{1N}$ and to provide the desired extent of actuation.

As shown in FIGS. 7a to 7e, at time $t_2$, second actuating element 16 reaches the requisite temperature $T_{2E}$ above its nominal working temperature $T_{2N}$ and the desired extent of actuation is provided. At that time, the rate of providing heat to second actuating element 16 is reduced to a level $P_{2N}$ that is significantly lower than the level $P_{2H}$ necessary to increase the temperature of second actuating element 16. Accordingly, the temperature of second actuating element 16 may be stabilized.

However, as shown in FIGS. 7a to 7e, actuator controller 30 may be arranged to provide heat to second actuating element 16 at a rate $P_{2N}$ that is lower than that which is necessary to maintain the temperature $T_2$ of second actuating element 16 at its existing temperature. Accordingly, the temperature $T_2$ of second actuating element 16 falls to a level $T_{2H}$ at which the temperature $T_2$ is maintained above the nominal working temperature $T_{2N}$ of second actuating element 16 by the rate $P_{2M}$ of providing heat to second actuating element 16. At the same time $t_2$, the rate $P_1$ of providing heat to first actuating element 15 is reduced, such that the temperature $T_1$ of the first actuating element 50 falls to its nominal working temperature $T_{1N}$.

Conveniently, by arranging the control of actuator system 10 in the manner discussed above, for example by maintaining the rate of providing heat to first actuating element 15 until second actuating element 16 has been heated sufficiently to provide the required extent of actuation, the subsequent rate of cooling of first and second actuating elements 15,16 may be sufficiently similar that the extent of actuation of actuator system 10 does not change during this time period. Accordingly, as shown, between a time period $t_2$ and a time period $t_3$, the temperature $T_1$ of first actuating element 15 falls from its original temperature $T_{1H}$ to its nominal working temperature $T_{1N}$, and the temperature $T_2$ of second actuating element 16 falls from its initial elevated temperature $T_{2E}$ to a temperature $T_{2H}$ at which second actuating element 16 provides the desired extent of actuation while first actuating element is at its nominal working temperature $T_{1N}$. Meanwhile, during the time period while first and second actuating elements 15,16 are cooling, the extent of actuation does not change.

As explained above, the actuator systems according to embodiments of the present invention may be used in a variety of situations. In an embodiment, the actuator system may be used within a lithographic apparatus. In a further embodiment, the actuator system may be used within a radiation beam conditioning system that conditions a beam of radiation. For example, a radiation beam conditioning system may be used as part of an illuminator that provides a beam of radiation from a radiation source to a patterning device.

Figure 8:
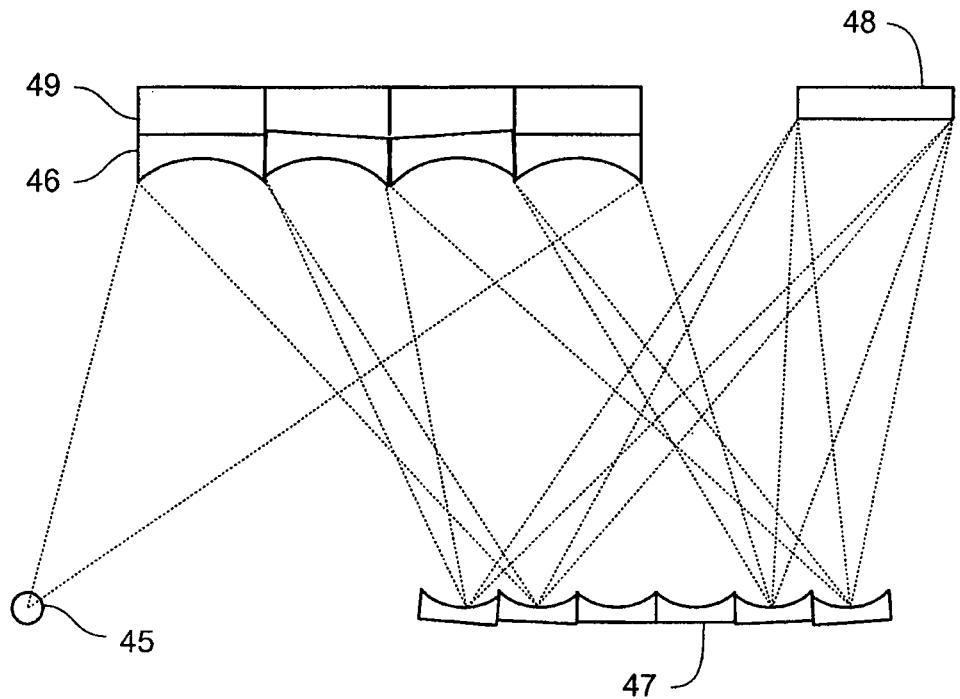
FIG. 8 depicts an arrangement of an illumination system that may use an actuator system according to an embodiment of the present invention.

FIG. 8 depicts schematically a part of an illumination system. In particular, as depicted, radiation is provided from a point of intermediate focus 45 to a first array of reflecting elements 46, which each focus a portion of the beam of radiation onto a respective reflecting element in a second array of reflecting elements 47. Each of the reflecting elements in second array of reflecting elements 47 is configured such that the field of the associated element in first array 46 is imaged onto a patterning device 48. Such an arrangement is commonly known as a 'fly's eye integrator' and reflectors in first array of reflectors 46 are commonly referred to as field facet mirrors, and reflectors in second array of reflectors 47 are commonly referred to as pupil facet mirrors. The arrangement is such that the field at patterning device 48 includes a summation of overlapping images of first array of reflectors 46, providing a mixing of the radiation emitted by the radiation source, providing improved illumination uniformity at patterning device 48.

As depicted in FIG. 8, the arrangement of first array of reflectors 46 and second array of reflectors 47 may be such that there are more reflectors in second array 47 than there are in first array 46. Furthermore, by controlling the position of the reflectors in first array of reflectors 46, one may control to which of second array of reflectors 47 each of the reflectors of first array of reflectors 46 directs the radiation incident on that reflector. Accordingly, one may control the angular distribution of the radiation directed onto patterning device 48. For example, in the arrangement depicted in FIG. 8, the radiation is directed by four reflectors in first array of reflectors 46 to selected reflectors in second array of reflectors 47 in order to provide a dipole illumination setting. It will be appreciated, however, that any number of reflectors may be provided in first array of reflectors 46 and each may be configured to be able to direct radiation incident on the reflector to one of a number of reflectors in second array of reflectors 47.

In order to control the position of the reflectors in first array of reflectors 46, respective actuators 49, such as the actuator systems discussed above, may be provided for each of the reflectors. Depending on the arrangement of the system, the position of the reflectors in second array of reflectors 47 may be fixed, for example if each only ever receives radiation from one reflector in first array of reflectors 46, if that reflector is in a particular position. Alternatively, actuators, such as the actuator systems discussed above, may be provided in order to control the position of the reflectors in second array of reflectors 47 in order to direct appropriately the radiation onto patterning device 48.

In a further embodiment of the present invention, actuator systems having actuating elements of an improved shape are provided. The following description describes an improved shape for a single actuating element, made from two sections of material having differing coefficients of thermal expansion. Such actuating elements may be used alone in order to form an actuating system according to an embodiment of the present invention, or in conjunction with another actuating element that is arranged to actuate in the opposite sense, namely the opposite direction, in order to provide an actuator system. In an actuator system having two actuating elements, one or both may be configured according to the following description.

Figure 9:
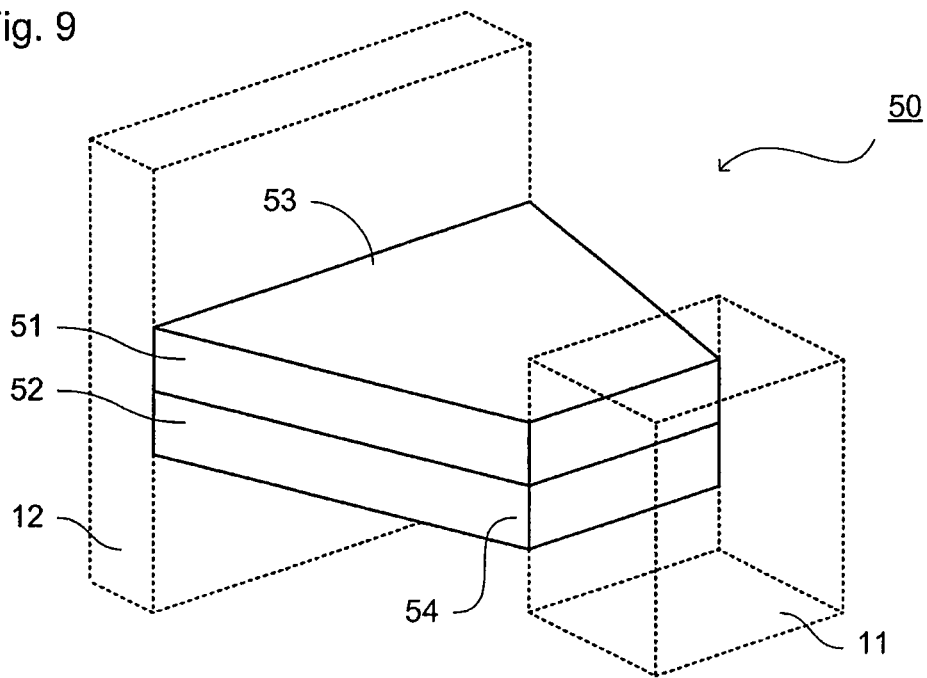
FIG. 9 depicts an actuator system according to an embodiment of the present invention.

FIG. 9 depicts an improved actuating element 50 according to an embodiment of the invention. As before, actuating element 50 includes first and second sections of material 51,52 that have different coefficients of thermal expansion. Each extends from a base 12 of the actuating system to a component 11 that is to be actuated. Both sections of material 51,52 extend from a first end 53 connected to base 12 to a second end 54 connected to component 11 to be actuated. According to this embodiment of the invention, first and second sections of material 51,52 are shaped such that the cross-sectional area of each of the sections of material 51,52 decreases from first end 53 to second end 54.

In an embodiment, as depicted in FIG. 9, first and second sections of material 51,52 may be configured to have a uniform thickness but have a tapering width. It will be appreciated, however, that other arrangements may also be used.

The provision of an actuating element 50 according to this embodiment of the invention may improve its performance characteristics. In an embodiment, for a desired extent of actuation of actuating element 50 and/or a desired force to be provided by actuating element 50, the heat that must be provided to actuating element 50 may be less than that which would be required for an actuating element made of sections of material having a uniform cross-section along their length. Furthermore, the time required for actuating element 50 to cool from an elevated temperature to, for example, a nominal working temperature may be reduced compared to an actuating element made from sections of material having a constant cross-sectional area.

A further embodiment of the present invention provides a particular arrangement for providing heating to an actuating element. The following description describes the heating system as applied to a single actuating element as described above. It should be appreciated that this heating system may be used for an actuator system that only includes a single actuating element. Alternatively, the heating system according to this embodiment of the invention may be used for an actuator system having multiple actuating elements, such as two actuating elements, for example arranged such that they provide actuation in opposite senses when heated, as described above. In that case, it should be appreciated that the heating system according to this embodiment of the invention may be applied to one or both of the actuating elements. Furthermore, although this aspect of the invention is described with reference to an actuating element that has sections of material with decreasing cross-sectional area along their length, it should be appreciated that this embodiment of the invention may also be used with actuating elements that are configured in another manner, for example having a constant cross-sectional area along their length.

According to this embodiment of the invention, the actuating element is connected to an electrically conducting loop such that the combination of the electrically conducting loop and the actuating element form an electrically conducting circuit. In order to provide heating to the actuating element, a current is induced in the electrical circuit formed by the actuating element and the electrically conducting loop, and the resistance of the actuating element to the flow of electrical current around the electrical circuit generates the heat required to actuate the actuating element.

The electrically conducting loop may be formed such that it has a lower electric resistance than one or both of the sections of material forming the actuating element. In particular, it may be formed from a material having a lower resistivity than the materials forming the actuating element. For example, the electrically conducting loop may be formed from copper. Alternatively or additionally, the cross-sectional area of the material forming the electrically conducting loop may be significantly larger than the cross-sectional area of the actuating element (in the direction of the electric current). Therefore, the heating system may be arranged such that significantly more heat is generated in the actuating element than in the electrically conducting loop.

Where a heat sink is provided, the electrically conducting loop may be thermally connected to the heat sink such that any heat that is generated within the electrically conducting loop is transferred to the heat sink and does not affect the heat provided to the actuating element. The electrically conducting loop may be mounted to the heat sink by means of a structure that is a poor electrical conductor compared to the electrically conducting loop but is a good thermal conductor. For example, the electrically conducting loop may be mounted to the heat sink by means of plates formed from $Al_2O_3$.

In an embodiment of the actuating element, a slot may be formed in both sections of material that constitute the actuating element. The slot may be provided to run from the first end of the actuating element, where the actuating element may be connected to the electrically conducting loop, towards the second end of the actuating element, but not run the entire length of the actuating element. Furthermore, the actuating element may be connected to the electrically conducting loop such that when an electrical current is induced in the electric circuit, the electric current flows through the actuating element on a first side of the slot from the first end to the second end, from the first side of the actuating element to the second side of the actuating element at the second end of the actuating element and then from the second end of the actuating element to the first end of the actuating element along the second side of the slot. Accordingly, by means of such an arrangement, the electrical current is caused to flow substantially throughout the length of the actuating element, providing heating throughout the length of the actuating element.

The current may be induced to flow in the electric circuit formed by the electrically conducting loop and the actuating element by means of a varying magnetic field applied to it. For example, an alternating current may be provided to one or more electrically conducting coils provided adjacent to the electrically conducting loop in order to provide the varying magnetic field. In this embodiment, the current is induced in the electric circuit formed by the electrically conducting loop and the actuating element in a corresponding fashion to a transformer. In that case, the one or more coils provided adjacent to the electrically conducting loop correspond to the primary windings of the 'transformer' and the electrical circuit formed by the electrically conducting loop and the actuating element correspond to the secondary windings of the 'transformer'.

Figure 10:
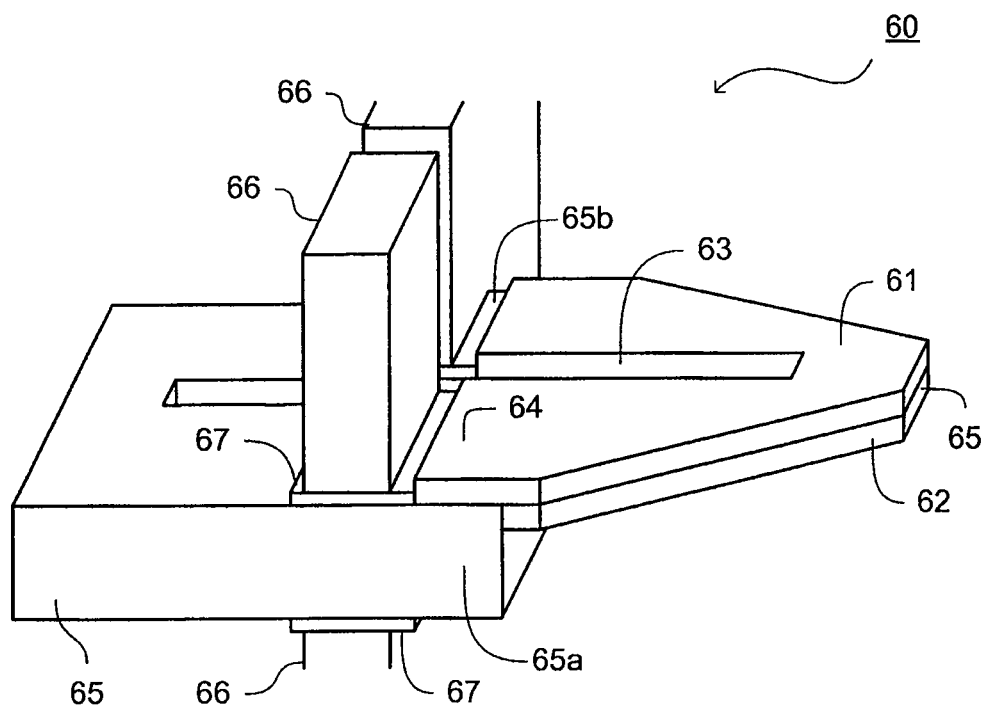
FIG. 10 depicts an actuator system according to a further embodiment of the present invention.

FIG. 10 depicts a possible arrangement of such an actuating element 60. In particular, the actuating element is formed from first and second sections of material 61,62 having different coefficients of thermal expansion. As shown, a slot 63 is formed within first and second sections of material 61,62, extending from a first end 64 of the actuating element towards a second end 68 of the actuating element, but not running the entirety of the length of actuating element 60.

First and second sections of material 61,62 are connected to an electrically conducting loop 65. In an embodiment, a first end 65a of the electrically conducting loop is connected to the first and second sections of material on a first side of slot 63 and a second end 65b of the electrically conducting loop is connected to first and second sections of material 61,62 on a second side of slot 63. Accordingly, electrically conducting loop 65 and first and second sections of material 61,62 together form an electrically conducting circuit. Accordingly, a varying magnetic field may induce an electric current to flow around the electrically conducting circuit such that that resistance of the first and second sections of material to the flow of electric current generates heating within actuating element 60.

Although not depicted in FIG. 10, as explained above, one or more coils of electrically conducting material, for example copper, may be provided adjacent to the portion of electrically conducting loop 65 that is away from actuating element 60. The current within the electric circuit formed by the electrically conducting loop and first and second sections of material 61,62 may be induced by providing an alternating current in the one or more electrically conducting loops in a known manner.

As explained above, if a heat sink is to be provided, such a heat sink 66 may be thermally connected to actuating element 60 and/or electrically conducting loop 65. For example, as shown in FIG. 10, electrically conducting loop 65 may be mounted to heat sink 66 by plates 67 of material that is electrically insulating but thermally conducting, for example thin plates of $Al_2O_3$.

A heating system according to this embodiment of the invention may provide an efficient system for providing a relatively large electric current to the actuating element, and therefore use the actuating element itself to provide the heating. In an embodiment, because the electric current is induced within an electric circuit that includes the actuating element, rather than, for example, by providing a voltage difference to separate contacts on the actuating element, losses at such contacts are avoided. In particular, the problems caused by resistance at such contacts, where a significant uncontrolled voltage drop may occur, are avoided. Furthermore, by providing the heating to the actuating element by means of a flow of electric current within the actuating element itself, there is no requirement to provide a separate heating element as part of the actuating element.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, embodiments of the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A lithographic apparatus comprising:
    a radiation beam conditioning system configured to condition a beam of radiation, wherein the radiation beam conditioning system comprises an optical element and an actuator system arranged to control a position of the optical element, the actuator system comprising:
        first and second actuating elements, each having a first end connected to a base of the actuator system and a second end connected to the optical element, the first actuating element comprising first and second sections of material that are joined to each other with both sections extending from the first end to the second end of the first actuating element, and the second actuating element comprising third and fourth sections of material that are joined to each other with both sections extending from the first end to the second end of the second actuating element, and
        at least one power supply, configured to provide heat to the first and second actuating elements, the at least one power supply controlling the heat provided to the first actuating element independently from the heat provided to the second actuating element, wherein:
            the optical element is set apart from the base in a first direction,
            the coefficient of thermal expansion of the first section of material is different from that of the second section of material,
            the coefficient of thermal expansion of the third section of material is different from that of the fourth section of material, and
            the first and second actuating elements are each configured such that, when the temperature of the actuating element increases from a nominal working temperature, the actuating element applies a force to the optical element to be actuated that is parallel to a second direction, perpendicular to the first direction, such that the force applied by the first actuating element when its temperature increases is in an opposite direction to the force applied by the second actuating element when its temperature increases;
    a patterning device configured to pattern the conditioned beam of radiation; and
    a projection system configured to project the patterned beam of radiation onto a substrate.

2. The lithographic apparatus according to claim 1, further comprising at least one heat sink maintained at a nominal heat sink temperature; wherein the first and second actuating elements are connected to the at least one heat sink for thermal transfer.

3. The lithographic apparatus according to claim 2, wherein the first and second actuating elements are connected for thermal transfer to a common heat sink.

4. The lithographic apparatus according to claim 2, wherein the actuator system comprises first and second heat sinks; and the first and second actuating elements are connected for thermal transfer to the first and second heat sinks, respectively.

5. The lithographic apparatus according to claim 2, wherein the nominal heat sink temperature is the nominal working temperature of the actuating elements.

6. The lithographic apparatus according to claim 2, wherein the nominal working temperature of the actuating elements is higher than the nominal heat sink temperature.

7. The lithographic apparatus according claim 2, further comprising an actuator controller configured to control the actuator system by controlling the heat provided to the first and second actuating elements by the at least one power supply.

8. The lithographic apparatus according to claim 7, wherein the actuator controller is configured to provide heat to the actuating elements to maintain the actuating elements at their respective nominal working temperatures above the nominal heat sink temperature in addition to heat required to raise the temperature of the actuating elements above their respective nominal working temperatures in order to actuate the actuator system as required.

9. The lithographic apparatus according to claim 7, wherein the actuator controller is configured such that, in order to actuate the actuator system from an unactuated position towards a first fully actuated position, the actuator controller provides heat to the first actuating element in order to raise the temperature of the first actuating element to a temperature above a nominal working temperature of the first actuating element.

10. The lithographic apparatus according to claim 9, wherein the actuator controller is configured such that, in order to actuate the actuator system from an unactuated position to a second fully actuated position in the opposite direction to the first fully actuated position, the actuator controller provides heat to the second actuating element in order to raise the temperature of the second actuating element to a temperature above a nominal working temperature of the second actuating element.

11. The lithographic apparatus according to claim 9, wherein the actuator controller is configured to raise the temperature of an actuating element above a nominal working temperature of the actuating element to provide a desired extent of actuation by providing heat to the actuating element at a first rate for a first duration of time and subsequently providing heat to the actuating element at a second rate; wherein the first rate is higher than the second rate and the second rate is sufficient to compensate for heat lost from the actuating element when it is at the temperature necessary in order to provide the desired extent of actuation.

12. The lithographic apparatus according claim 1, wherein at least one of the actuating elements is configured such that the cross-sectional area of at least one of the sections of material comprising the actuating element decreases from the first end to the second end.

13. The lithographic apparatus according claim 1, further comprising an electrically conducting loop, connected to one of the actuating elements such that the electrically conducting loop and the actuating element together form an electric circuit; wherein the power supply is configured to induce an electric current in the electric circuit.

14. The lithographic apparatus according to claim 13, wherein the actuator system comprises one or more coils of electrically conducting material connected to the power supply, wherein the power supply is configured to provide an alternating current in the one or more coils and the one or more coils are configured such that the alternating current generates a varying magnetic field that induces the electric current in the electric circuit formed by the electrically conducting loop and the actuating element.

15. A method of manufacturing a device, comprising:
conditioning a beam of radiation using a radiation beam conditioning system;
patterning the conditioned beam of radiation;
projecting the patterned beam of radiation onto a substrate using a projection system;
controlling the position of at least one optical component of the radiation beam conditioning system or the projection system using an actuator system configured to move the optical component relative to a base of the actuator system that is set apart from the optical component in a first direction, wherein:
the actuator system comprises first and second actuating elements, each having a first end connected to the base and a second end connected to the optical component, the first actuating element comprising first and second sections of material that are joined to each other with both sections extending from the first end to the second end of the first actuating element, and the second actuating element comprising third and fourth sections of material that are joined to each other with both extending from the first end to the second end of the second actuating element;
the coefficient of thermal expansion of the first section of material is different from that of the second section of material;
the coefficient of thermal expansion of the third section of material is different from that of the fourth section of material; and
the first and second actuating elements are each configured such that, when the temperature of the actuating element increases from a nominal working temperature, the actuating element applies a force to the optical component to be actuated that is parallel to a second direction, perpendicular to the first direction, and such that the force applied by the first actuating element when its temperature increases is in an opposite direction to the force applied by the second actuating element when its temperature increases; and
providing heat to the first and second actuating elements in order to actuate the actuator system, wherein the heat is provided to the first actuating element independently from the heat provided to the second actuating element.

* * * * *